United States Patent
Lee et al.

(10) Patent No.: US 7,420,387 B2
(45) Date of Patent: Sep. 2, 2008

(54) SEMICONDUCTOR DEVICE CAPABLE OF CONTROLLING OCD AND ODT CIRCUITS AND CONTROL METHOD USED BY THE SEMICONDUCTOR DEVICE

(75) Inventors: Woo-Jin Lee, Seognam-si (KR); Kwang-Il Park, Yongin-si (KR); Hyun-Jin Kim, Suwon-si (KR); Seong-Jin Jang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 32 days.

(21) Appl. No.: 11/402,123

(22) Filed: Apr. 11, 2006

(65) Prior Publication Data

US 2006/0226868 A1    Oct. 12, 2006

(30) Foreign Application Priority Data

Apr. 12, 2005  (KR) .................. 10-2005-0030432

(51) Int. Cl.
*H03K 17/16*  (2006.01)
(52) U.S. Cl. ........................................ 326/30
(58) Field of Classification Search .............. 326/30, 326/86
See application file for complete search history.

(56) References Cited

U.S. PATENT DOCUMENTS

| | | | | |
|---|---|---|---|---|
| 6,307,424 B1 * | 10/2001 | Lee | ............................ | 327/530 |
| 6,573,746 B2 * | 6/2003 | Kim et al. | ...................... | 326/30 |
| 6,693,450 B1 * | 2/2004 | Volk et al. | ..................... | 326/30 |
| 7,342,412 B2 * | 3/2008 | Kim | ............................. | 326/30 |
| 2005/0012533 A1 * | 1/2005 | Aoyama et al. | ............. | 327/170 |
| 2005/0116736 A1 * | 6/2005 | Blodgett et al. | ............... | 326/30 |

FOREIGN PATENT DOCUMENTS

KR    10-2004-0043995       5/2004

* cited by examiner

*Primary Examiner*—Rexford Barnie
*Assistant Examiner*—Jany Tran
(74) *Attorney, Agent, or Firm*—F. Chau & Associates, LLC

(57) ABSTRACT

Provided is a semiconductor device capable of controlling an on-die-termination (ODT) circuit and an off-chip-driver (OCD) circuit and a control method used by the semiconductor device. The semiconductor device includes a control code generation unit generating a control code in response to a control signal, an addition unit adding an adjustment code to the control code to produce an adjusted control code, and an ODT circuit, wherein an impedance of the ODT circuit is adjusted in response to the adjusted control code. The semiconductor device can adjust the control code more precisely by adding or subtracting the adjustment code to or from the control code. Accordingly, the impedance of an OCD circuit or ODT circuit can be adjusted more precisely.

14 Claims, 4 Drawing Sheets

US 7,420,387 B2

SEMICONDUCTOR DEVICE CAPABLE OF CONTROLLING OCD AND ODT CIRCUITS AND CONTROL METHOD USED BY THE SEMICONDUCTOR DEVICE

This application claims priority to Korean Patent Application No. 2005-0030432, filed on Apr. 12, 2005, in the Korean Intellectual Property Office, the disclosure of which is incorporated by reference herein.

BACKGROUND OF THE INVENTION

1. Field of the Invention

The present invention relates to a semiconductor device and a control method used by the same, and more particularly, to a semiconductor device capable of precisely controlling an on-die-termination (ODT) circuit and an off-chip-driver (OCD) circuit and a method of controlling the same.

2. Description of the Related Art

The effects of the flow of data, data strobes, and AC parameters related to input and output of addresses and control signals have become increasingly more critical to the design of high-frequency double data rate (DDR) semiconductor devices. The electrical characteristics of a channel connecting two or more components, e.g., a DRAM or a CPU, can often be more important than those of the components themselves.

A plurality of components are connected by a channel, and a signal is input and output though a pad included in each component. A signal output from a component passes through an off-chip-driver (OCD) circuit, usually with impedance control and is output to a channel via a pad. In addition, a signal from the channel passes through an on-die-termination (ODT) circuit and is input to the component via the pad.

The ODT and OCD circuit within the component are implemented with adjustable impedance to improve the electrical characteristics of the channel. The impedance is adjusted by a control code generated by a calibration loop or a code controller unit.

The calibration loop generates a control code for adjusting the impedance of the ODT and OCD circuit in response to a control signal input from an external source. Similarly, the code control unit generates a control code for adjusting the impedance of the ODT and OCD circuit in response to a control signal, which is generated in response to an external mode register set signal.

FIGS. 1 and 2 are block diagrams of conventional semiconductor devices 100 and 200 capable of controlling ODT circuits 130 and 230, and OCD circuits. Referring to FIG. 1, the semiconductor device 100 includes a calibration loop 110, the ODT circuit 130, and a pad 150. The calibration loop 110 generates first and second control codes CTRL1 and CTRL2 to adjust the impedance of the ODT circuit 130 in response to a control signal EXZQ, which is generated in response to the impedance of an external reference resistor (not shown).

The impedance of the ODT circuit 130 is adjusted to match the characteristics of a channel (not shown). Accordingly, a signal is input to the semiconductor device 100 without distortion caused by noise or channel characteristics.

As illustrated in FIG. 1, the ODT circuit 130 includes a plurality of upper transistors that operate in response to the first control code CTRL1 and a plurality of lower transistors that operate in response to the second control code CTRL2.

The transistors included in the ODT circuit 130 are turned on or off in response to the first and second control codes CTRL1 and CTRL2. By adjusting transistor states, one can adjust the overall impedance of the ODT circuit 130.

Although not shown in FIG. 1, the semiconductor device 100 of FIG. 1 may further include an OCD circuit. The impedance of the OCD circuit (not shown) may be adjusted by using the method of adjusting the impedance of the ODT circuit 130.

Referring to FIGS. 1 and 2, the semiconductor device 200 of FIG. 2 has the same structure as the semiconductor device 100 of FIG. 1 except that the semiconductor device 200 uses a code controller 210 instead of the calibration loop 110.

The code controller 210 generates first and second control codes CTRL1 and CTRL2, which are binary signals, in response to a control signal EMRS generated in response to an external mode register set signal. The impedance of the ODT circuit 230 is adjusted in response to the first and second control codes CTRL1 and CTRL2.

The semiconductor device 100, using the calibration loop 110 that operates in response to an external control signal, or the semiconductor device 200, using the code controller 210 that operates in response to the control signal EMRS generated in response to the external mode register set signal, can generate definite control codes unaffected by process, voltage, and temperature changes.

However, the conventional semiconductor device 100 or 200 may have an offset due to various external factors, including process, voltage, and temperature (PVT) variations. In addition, although the semiconductor device 100 or 200 is designed to have a minimum offset, the channel characteristics of the semiconductor device 100 or 200 needs to be improved. Therefore, the impedance of the semiconductor device 100 or 200 should be adjusted precisely to improve performance.

As the semiconductor device 100 or 200 operates at higher and higher frequencies, the driver intensity and impedance of the OCD circuit need to be controlled more precisely. However, the semiconductor device 100 or 200 cannot alter the fixed external resistance even when the impedance of the OCD circuit needs to be adjusted to improve channel characteristics. Thus, it is difficult to precisely control the impedance of the OCD circuit.

If the number of bits of the external mode register set signal used in the code controller 210 is increased, the impedance of the OCD circuit may be more precisely controlled. However, an increase in the number of bits of the external mode register set signal complicates the circuit structure of the semiconductor device 200.

SUMMARY OF THE INVENTION

According to an exemplary embodiment of the present invention, there is provided a semiconductor device comprising a control code generation unit, an addition unit, and an on-die termination (ODT) circuit. The control code generation unit outputs a control code in response to a control signal. The addition unit adds an adjustment code to the control code to produce an adjusted control code. The impedance of the on-die-termination (ODT) circuit is adjusted in response to the adjusted control code.

The on-die termination circuit may comprise a plurality of transistors.

The semiconductor device may include an off-chip-driver (OCD) circuit. The impedance of the off-chip-driver circuit may be adjusted in response to the adjusted control code.

The off-chip-driver (OCD) circuit may comprise a plurality of transistors.

According to an exemplary embodiment of the present invention, there is provided a method comprising: generating a control code in response to a control signal; adding an adjustment code to the control code to produce an adjusted control code; and adjusting an impedance of an ODT circuit in response to the adjusted control code.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1:
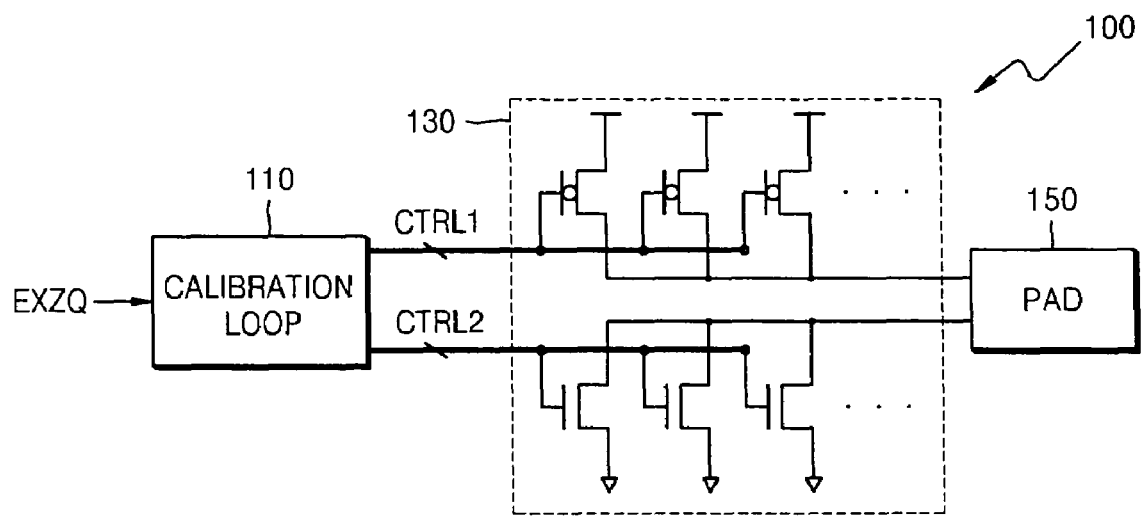
FIG. 1 is a block diagram of a conventional semiconductor device capable of controlling an off-chip-driver (OCD) circuit and an on-die-termination (ODT) circuit.
Figure 2:
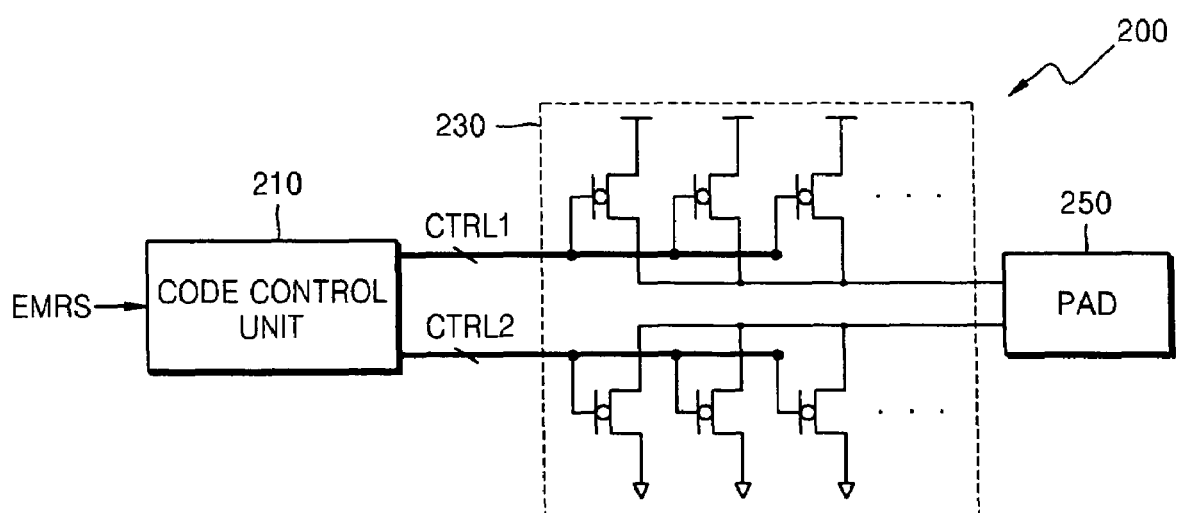
FIG. 2 is a block diagram of another conventional semiconductor device capable of controlling an OCD circuit and an ODT circuit.

Hereinafter, exemplary embodiments of the present invention will be described in detail with reference to the attached drawings. Like reference numerals in the drawings denote like elements, and thus their description will omitted.

Figure 3:
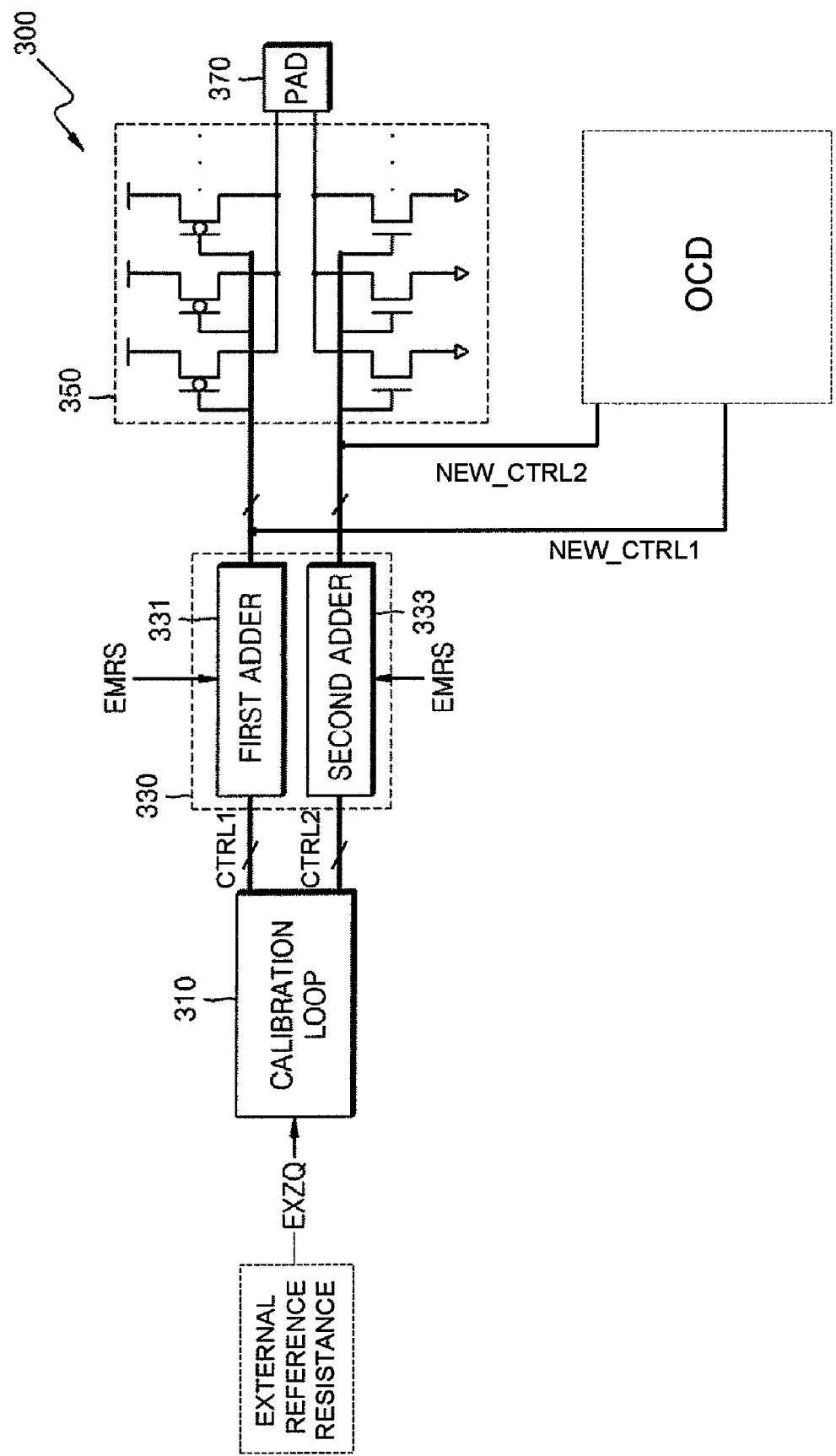
FIG. 3 is a block diagram of a semiconductor device capable of controlling an OCD circuit and an ODT circuit according to an exemplary embodiment of the present invention.

FIG. 3 is a block diagram of a semiconductor device 300 capable of controlling an off-chip-driver (OCD) circuit and an on-die-termination (ODT) circuit 350 according to an exemplary embodiment of the present invention. The semiconductor device 300 includes a calibration loop 310, an addition unit 330, the ODT circuit 350, and a pad 370. The calibration loop 310 may be regarded as a control code generation unit generating first and second control codes CTRL1 and CTRL2 in response to a control signal EXZQ.

The control signal EXZQ is generated in response to reference resistance (not shown) external to the semiconductor device 300. The control signal EXZQ is input to the semiconductor device 300 through an input/output pin (not shown) included in the semiconductor device 300. The calibration loop 310 removes noise from the input control signal EXZQ and generates the first and second control codes CTRL1 and CTRL2.

The addition unit 330 adds an adjustment code EMRS to the first and second control codes CTRL1 and CTRL2 and generates first and second adjusted control codes NEW_CTRL1 and NEW_CTRL2.

The addition unit 330 includes a first adder 331 and a second adder 333. The first adder 331 adds the adjustment code EMRS to the first control code CTRL1 and generates the first adjusted control code NEW_CTRL1. Similarly, the second adder 333 adds the adjustment code EMRS to the second control code CTRL2 and generates the second adjusted control code NEW_CTRL2.

In an exemplary embodiment, the adjustment code EMRS is generated in response to an external mode register set signal. Therefore, when the external mode register set signal is adjusted, the adjustment code EMRS is adjusted accordingly.

The impedance of the ODT circuit 350 is controlled in response to the first and second adjusted control codes NEW_CTRL1 and NEW_CTRL2. The ODT circuit 350 includes a plurality of upper transistors each of which is turned on or off in response to the first adjusted control code NEW_CTRL1 and a plurality of lower transistors each of which is turned on or off in response to the second adjusted control code NEW_CTRL 2.

The upper transistors are connected to a voltage source, and the lower transistors are connected to a ground source. The impedance of the ODT circuit 350 is controlled by pull-up operations of the upper transistors, which are turned on in response to the first adjusted control code NEW_CTRL1, and pull-down operations of the lower transistors, which are turned on in response to the second adjusted control code NEW_CTRL2.

The transistors included in the ODT circuit 350 are pulled up to the voltage source or down to the ground source in response to an adjusted control code NEW_CTRL from the addition unit 330. The overall impedance of the ODT circuit 350 is adjusted in response to the pull-up or pull-down operations of the transistors.

The operations of the addition unit 330 and the ODT circuit 350 will now be described using an example. In this example, seven transistors are connected to the first adder 331 and the second adder 333, respectively, and the first and second adjusted control codes NEW_CTRL1 and NEW_CTRL2 have 7 bits, respectively.

If the first adjusted control code NEW_CTRL1 output from the first adder 331 is 0010110, the first, second, fourth, and seventh transistors of the seven transistors connected to the first adder 331 are turned on and the third, fifth, and sixth transistors are turned off.

Similarly, if the second adjusted control code NEW_CTRL2 output from the second adder 333 is 1010000, the first and third transistors of the seven transistors connected to the second adder 333 are turned on and the second, fourth, fifth, sixth, and seventh transistors are turned off.

The transistors are configured such that they are pulled up or pulled down in response to an output from the addition unit 330. Such a configuration aims not only to adjust the impedance of the ODT circuit 350 but also to control the pull-up/down operations of the transistors.

The pad 370 allows a signal to be input to or output from the semiconductor device 300. A signal input or output via the pad 370 is transmitted through a channel (not shown) connecting the semiconductor device 300 and other semiconductor devices (not shown). The impedance of the ODT circuit 350 should be adjusted according to the electrical characteristics of the channel so that a signal is input to the semiconductor device 300 without distortion.

Figure 4:
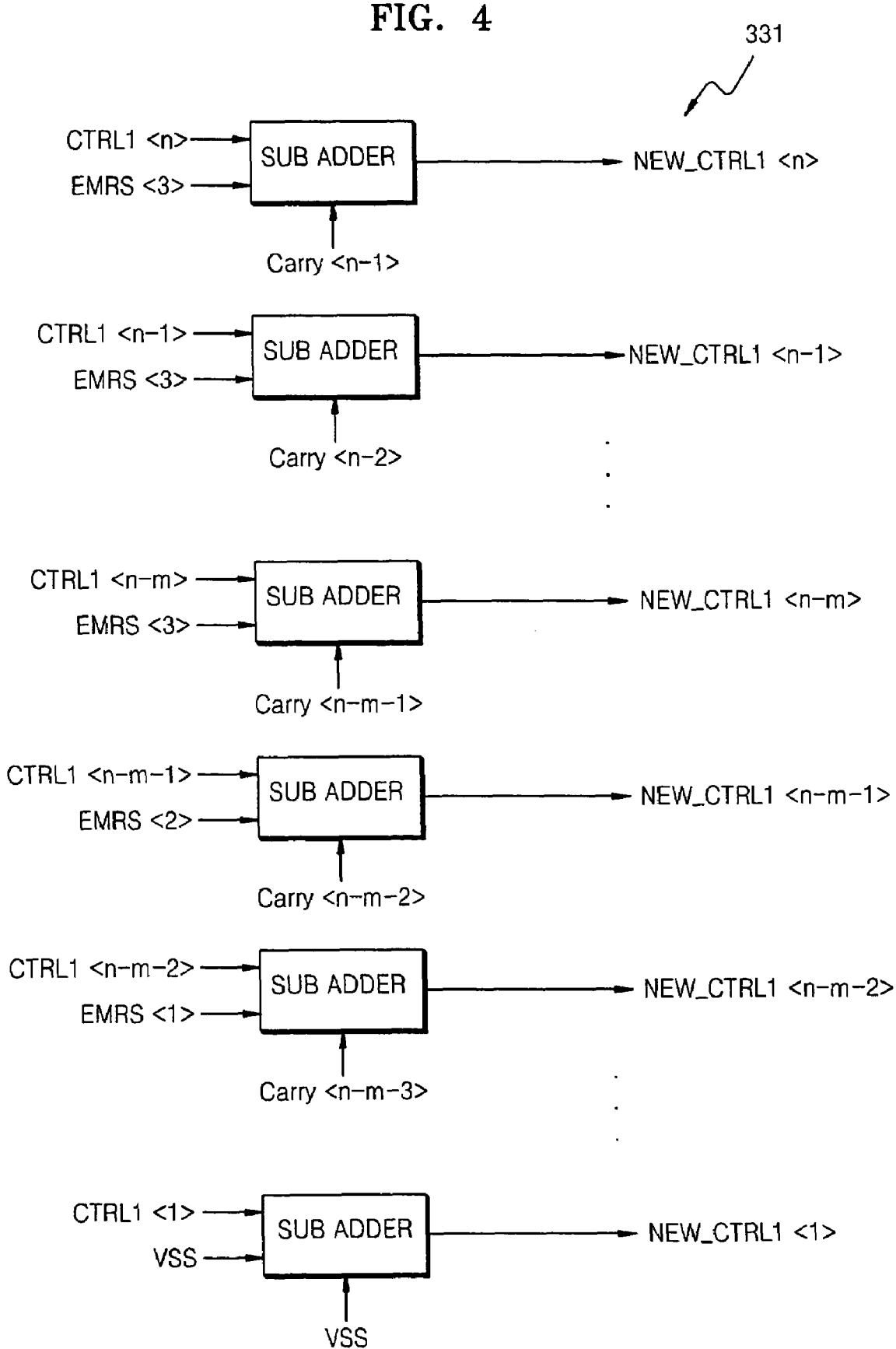
FIG. 4 is a detailed block diagram of an adder illustrated in FIG. 3 according to an exemplary embodiment of the present invention.

The first and second adders 331 and 333 included in the addition unit 330 of FIG. 3 have the same structure. FIG. 4 is a detailed block diagram of an exemplary embodiment of the first adder 331 illustrated in FIG. 3.

The first adder 331 includes a plurality of sub adders. Each of the sub adders adds corresponding bits of the first control code CTRL1, the adjustment code EMRS, and a carry bit.

In the present exemplary embodiment, the number of bits of the first control code CTRL1 is larger than that of the adjustment code EMRS. In addition, the starting position of the first control code CTRL1 to which the adjustment code EMRS is added may vary.

In this exemplary embodiment, it is assumed that the first control code CTRL [1:n] has 7 bits (that is, n=7), the adjustment code EMRS [1:3] has 3 bits, and the adjustment code EMRS[1:3] is added to bits CTRL1 [3:5] where the most significant bit (MSB) of the first control code CTRL1 [1:7] is CTRL[7].

In the present exemplary embodiment, since the number of bits of the adjustment code EMRS[1:3] is smaller than that of the first control code CTRL1 [1:7], the first adder 331 converts the adjustment code EMRS[1:3] to have a number of bits equal to the first control code CTRL1 [1:7] and adds a converted adjustment code EMRS[1:7] to the first control code CTRL1 [1:7].

The 3 bit adjustment code EMRS[1:3] now becomes a 7 bit converted adjustment code EMRS[1:7]. Bits 3-5 of the 7 bit converted adjustment code are set to the values of the 3 bit adjustment code. Bits of the converted 7 bit adjustment code below bit 3 are set to zero, i.e. a ground source voltage VSS. Bits of the converted 7 bit adjustment code above bit 5 are set to the most significant bit (MSB) of the 3 bit adjustment code. In this example, the most significant bit of the 3 bit adjustment code is bit 3.

For example, if the first control code CTRL1 is 1001001 and the adjustment code is 010, a converted 7 bit adjustment code is generated with bits 3-5 set to 010. 2 bits lower than bit 3 of the 7 bit converted adjustment code EMRS[1:7] are set to zero. In addition, since the MSB of the 3 bit adjustment code EMRS[1:3], bit 3, is zero, 2 bits higher than bit 5 of the 7 bit converted adjustment code EMRS[1:7] are set to zero.

Consequently, the first adder 331 converts the adjustment code EMRS [1:3], which is 010, into 0001000 and adds 0001000 to 1001001, which is the first control code CTRL [1:7]. Then, the first adder 331 generates 1010001, which is the first adjusted control code NEW_CTRL1 [1:7].

If the first control code CTRL1 is 1001001 and the adjustment code EMRS is 110, 2 bits lower than bit 3 of the converted adjustment code EMRS[1:7] are set to zero. In addition, since the MSB of the adjustment code EMS[1:3], bit 3, is 1, 2 bits higher than bit 5 of the converted adjustment code EMRS[1:7] are set to 1.

Consequently, the first adder 331 converts the adjustment code EMRS [1:3], which is 110, into 1111000 and adds 1111000 to 1001001, which is the first control code CTRL [1:7]. Then, the first adder 331 generates 1000001, which is the first adjusted control code NEW_CTRL1 [1:7].

The first adder 331 adds the adjustment code EMRS to the first control code CTRL1 when the MSB of the adjustment code EMRS is zero and generates the first adjusted control code NEW_CTRL1, and subtracts the adjustment code EMRS from the first control code CTRL1 when the MSB of the adjustment code EMRS is 1 and generates the first adjusted control code NEW_CTRL1.

The use of an adjustment code EMRS allows the precise adjustment of the first and second adjustment codes CTRL1 and CTRL2 to produce the respective codes NEW_CTRL1 and NEW_CTRL2, thereby precisely adjusting the impedance of the ODT circuit 350.

The semiconductor device 300 may further include the OCD circuit (not shown) whose impedance is adjusted in response to the first and second control codes NEW_CTRL1 and NEW_CTRL2.

Like the ODT circuit 350, the OCD circuit includes a plurality of transistors, and an impedance of the OCD circuit is adjusted as the transistors are turned on or off in response to the first and second adjusted control codes NEW_CTRL1 and NEW_CTRL2.

If the semiconductor device 300 further includes the OCD circuit, the calibration loop 310 may generate a control code for controlling the OCD circuit. The addition unit 330 may further include a third adder (not shown) for adding the control code to the adjustment code EMRS for controlling the OCD circuit.

Figure 5:
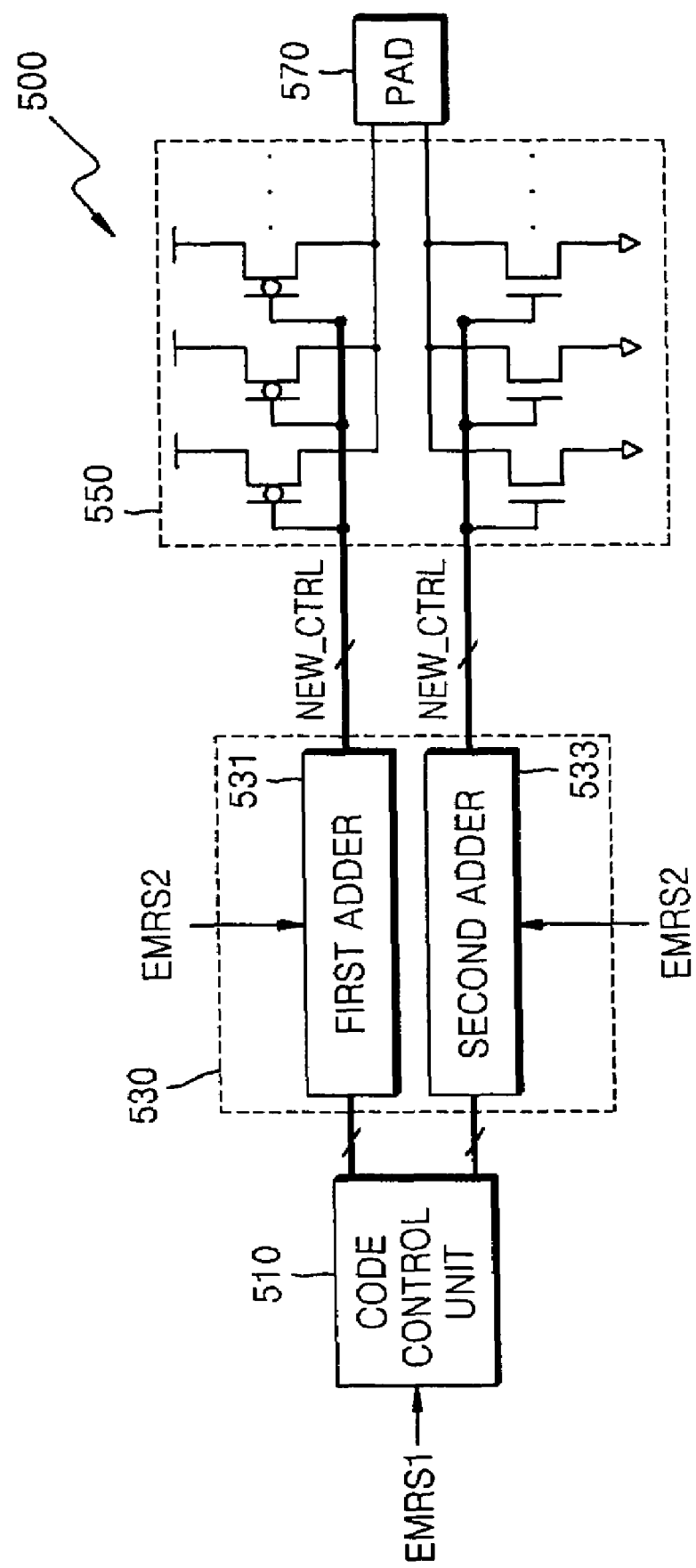
FIG. 5 is a block diagram of a semiconductor device capable of controlling an OCD circuit and an ODT circuit according to an exemplary embodiment of the present invention.

FIG. 5 is a block diagram of a semiconductor device 500 capable of controlling an OCD circuit and an ODT circuit 550 according to an exemplary embodiment of the present invention. The semiconductor device 500 includes a code control unit 510, an addition unit 530, the ODT circuit 550, and a pad 570. The code control unit 510 generates first and second control codes CTRL1 and CTRL2 in direct response to a control signal EMRS1. The control signal EMRS1 is generated in response to a mode register set signal input from an external source.

Like the calibration loop 310 illustrated in FIG. 3, the code control unit 510 may be regarded as a control code unit generating the first and second control codes CTRL1 and CTRL2 in response to the control signal EMRS1.

Operations of the semiconductor device 500 of FIG. 5 are identical to those of the semiconductor device 300 except for the code control unit 510.

In the semiconductor device 500 according to the present exemplary embodiment, the first and second control codes CTRL1 and CTRL2 and the adjustment code EMRS are generated in response to the mode register set signal input to the semiconductor device 500 from an external source. The semiconductor device 500 can precisely adjust the impedance of the ODT circuit 550 more easily than the semiconductor device 300 of FIG. 3.

An adjustment code is generated in response to a mode register set signal after a control code for determining impedance of an ODT or OCD circuit is generated. A semiconductor device according to an exemplary embodiment of the present invention adds or subtracts the adjustment code to or from the control code to adjust the control code more precisely. Accordingly, the impedance of the OCD or ODT circuit can be adjusted more precisely.

In addition, the semiconductor device can precisely adjust the impedance of the OCD or ODT circuit to improve electrical characteristics of a channel without modifying a calibration loop that generates a control code.

Furthermore, the semiconductor device can precisely adjust the impedance of the OCD or ODT circuit using an addition unit. By adjusting the numbers of control codes and adders, the semiconductor device can adjust not only the impedance of the OCD or ODT circuit but also pull-up or pull-down operations.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a control code generation unit generating a control code in response to a control signal;
   an addition unit adding a first adjustment code to the control code to generate an adjusted control code; and
   an on-die-termination (ODT) circuit, wherein an impedance of the ODT circuit is adjusted in response to the adjusted control code,
   wherein the control signal and the first adjustment code are generated in response to an external mode register set signal.

2. The device of claim 1, wherein the ODT circuit comprises a plurality of transistors,
wherein the transistors are turned on or off in response to the adjusted control code to adjust the impedance of the ODT circuit.

3. The device of claim 1, wherein a total bit count of the control code is greater than a total bit count of the first adjustment code, and a starting bit position of the control code to which the first adjustment code is added may vary.

4. The device of claim 1, further comprising an off-chip-driver (OCD) circuit having an impedance adjusted in response to the adjusted control code.

5. The device of claim 4, wherein the OCD circuit comprises a plurality of transistors,
wherein the transistors are turned on or off in response to the adjusted control code to adjust the impedance of the OCD circuit.

6. The device of claim 1, wherein the control signal is generated in response to an external reference resistance, and the control code generation unit is a calibration loop removing noise from the control signal and generating the control code.

7. A control method comprising:
generating a control code in response to a control signal;
adding a first adjustment code to the control code to generate an adjusted control code; and
adjusting an impedance of an ODT circuit in response to the adjusted control code,
wherein the control signal and the first adjustment code are generated in response to an external mode register set signal.

8. The method of claim 7, wherein, a plurality of transistors included in the ODT circuit are turned on or off to adjust the impedance of the ODT circuit.

9. The method of claim 7, wherein a total bit count of the control code is greater than a total bit count of the first adjustment code, and a starting bit position of the control code to which the first adjustment code is added may vary.

10. The method of claim 7, further comprising adjusting the impedance of an OCD circuit in response to the adjusted control code.

11. The method of claim 10, wherein, a plurality of transistors included in the OCD circuit are turned on or off to adjust the impedance of the OCD circuit.

12. The method of claim 7, wherein the control signal is generated in response to an external reference resistance, and noise is removed from the control signal and the control code is generated.

13. A semiconductor device comprising:
a control code generation unit generating a control code in response to a control signal;
an addition unit generating a second adjustment code from a first adjustment code and adding the second adjustment code to the control code to generate an adjusted control code; and
an on-die-termination (ODT) circuit, an impedance of the ODT circuit being adjusted in response to the adjusted control code,
wherein the second adjustment code comprises a lower, middle, and upper bit group,
wherein each bit of the lower bit group is 0, the middle bit group corresponds to the first adjustment code, and each of the bits of the upper bit group are set to the most significant bit of the first adjustment code.

14. A control method comprising:
generating a control code in response to a control signal;
selecting a starting bit position SBP of the control code having a total bit count CTBC;
copying the bits of the first adjustment code having a total bit count of ATBC to a second adjustment code starting at bit position SBP where the second adjustment code has a total bit count equal to CTBC;
setting the bits of the second adjustment code below bit position SBP-ATBC+1 to 0;
setting the bits of the second adjustment code above bit position SBC to the most significant bit of the first adjustment code;
adding the second adjustment code to the control code to produce an adjusted control code; and
adjusting an impedance of an ODT circuit in response to the adjusted control code,
wherein SBP, ATBC, and CTBC are integers greater than 0.

* * * * *